United States Patent [19]

Kitamura

[11] Patent Number: 5,579,155
[45] Date of Patent: Nov. 26, 1996

[54] SEMICONDUCTOR OPTICAL AMPLIFIER

[75] Inventor: Mitsuhiro Kitamura, Tokyo, Japan

[73] Assignee: NEC Corporation, Japan

[21] Appl. No.: 337,271

[22] Filed: Nov. 10, 1994

[30] Foreign Application Priority Data

Nov. 11, 1993 [JP] Japan ................... 5-282240

[51] Int. Cl.⁶ .................... H01S 3/19; H01S 3/18
[52] U.S. Cl. ................. 359/344; 359/337; 250/214 LA; 257/14
[58] Field of Search .................. 359/337, 344; 250/214 LA; 257/14; 372/43, 45

[56] References Cited

U.S. PATENT DOCUMENTS

| 4,470,143 | 9/1984 | Kitamura et al. | 372/50 |
| 5,084,894 | 1/1992 | Yamamoto | 372/50 |
| 5,175,643 | 12/1992 | Andrews | 359/339 |
| 5,184,247 | 2/1993 | Schimpe | 359/344 |
| 5,196,958 | 3/1993 | Verbeek et al. | 359/344 |

FOREIGN PATENT DOCUMENTS

| 6060093 | 7/1994 | European Pat. Off. . |
| 1-268084 | 10/1989 | Japan . |
| 4-105383 | 4/1992 | Japan . |
| 4-303982 | 10/1992 | Japan . |
| 7135372 | 5/1995 | Japan . |

*Primary Examiner*—Nelson Moskowitz

[57] ABSTRACT

A semiconductor optical amplifier having a large gain and a high saturation optical output power has a uniform cross-section of an active layer. In the semiconductor optical amplifier, the band gap wavelength of the active layer in the vicinity of the light-emitting end is shorter than that in the vicinity of the light-receiving end. The active layer may have a multiple quantum well structure, or the active layer may have a tesile-strained (compressively strained) multiple quantum well structure in which the absolute strain quantity in the vicinity of the light-emitting end is larger than that in the vicinity of the light-receiving end.

7 Claims, 2 Drawing Sheets

SEMICONDUCTOR OPTICAL AMPLIFIER

BACKGROUND OF THE INVENTION (a) Field of the Invention

The present invention relates to semiconductor optical amplifiers used in optical communication systems or optical switchboard systems.

(b) Description of Related Art

In optical fiber communication systems, optical amplifiers play an important role in attaining a longer transmission distance. Especially, technical improvements in optical fiber amplifiers having a core doped with erbium have developed remarkably, which has greatly furthered practical use of optical fiber communication together with increased output power and reliability of light exciter. Compared with optical fiber amplifiers, semiconductor optical amplifiers are smaller, consume less power and can be formed in an array more easily. Accordingly, they are especially important for applications such as loss compensation for optical switches used in multi-channel optical transmission systems or optical switchboard systems.

Such a semiconductor optical amplifier should have a large gain and a high saturation optical output power while the gain should have a low dependence on the plane of polarization (hereinafter referred to as a "polarization sensitivity" or "polarization plane dependence"). In an ordinary semiconductor optical amplifier having an embedded active layer, since the cross-sectional area of the active layer perpendicular to the propagation direction of a signal light is constant, the intensity of the signal light becomes strong in the vicinity of the emitting end for the signal light (hereinafter referred to as "light-emitting end") due to amplification of the signal light, resulting in an increased consumption of carriers. This is apt to induce a saturation of gain.

To solve this problem, an improved semiconductor optical amplifier is proposed in which the cross-section of the active layer perpendicular to the propagation direction of light is made larger from the receiving end for the signal light (hereinafter referred to as a "light-receiving end") toward a light-emitting end has been proposed, as described in JP-A-89-268084.

In the semiconductor optical amplifier described in the publication as mentioned above, however, the saturation value of optical output power is lowered because the mode cross-sectional area of light becomes smaller when the width and thickness of tile active layer at the light-emitting end are increased. Moreover, the polarization plane dependence of gain increases when only the width of the active layer is increased. Accordingly, it has been difficult to obtain a semiconductor optical amplifier which attains a large gain, a low polarization plane dependence of gain and a large saturation value of optical output power simultaneously.

SUMMARY OF THE INVENTION

In view of the foregoing, it is an object of the present invention to provide a semiconductor optical amplifier which attains a large gain, a low polarization plane dependence of a gain and a large saturation optical output power simultaneously.

A semiconductor optical amplifier according to the present invention comprises a semiconductor substrate, a semiconductor active layer formed overlying the substrate for amplifying a signal light received through light-receiving end of the active layer to emit the amplified signal light through a light-emitting end of the active layer, the active layer having a first band gap wavelength in the vicinity of the light-receiving end and a second band gap wavelength in the vicinity of the light-emitting end, the first band gap wavelength being longer than the second band gap wavelength.

To reduce the polarization plane dependence of gain in a semiconductor optical amplifier, it is effective to form an active layer having a substantially rectangular cross-section, thereby equalizing the light confinement coefficient of both TE and TM modes or to use a multiple quantum well active layer having a tensile strain.

On tile other hand, the saturation value of optical output power varies in proportion to (A/a·τ) in a semiconductor optical amplifier comprising an active layer having a uniform composition in compound along the direction of laser light propagation. Here "A", "a" and "τ" represent a mode cross-sectional area of light, a differentiated gain and a lifetime of injected carriers during forward-biasing of an amplifier, respectively. Therefore, it is effective to increase the mode cross-sectional area of light by using a multiple quantum well (MQW) active layer.

Saturation of optical output power is caused by an increase in the light intensity in the vicinity of the light-emitting end. In detail, when the intensity of light is increased in the vicinity of the light-emitting end, many carriers are consumed due to stimulated emission so that the carrier density or the gain at that location decreases. Above situations are shown in FIG. 1, which illustrates the spectral dependence curves $b_1$ and $b_2$ of gain in a conventional optical amplifier measured in the vicinity of its light-receiving end and measured in the vicinity of its light-emitting end, respectively. When the reflection coefficients on the both ends are sufficiently reduced and carriers are injected at a high level, carrier density can be raised as high as about 5-6E18/cm$^3$, which is three to four times higher compared with the threshold carrier density of an ordinary laser oscillator. Since the signal light is amplified during propagation along the active layer toward the light-emitting end, the carrier density in equilibrium in the vicinity of the light-emitting end is smaller than that in the vicinity of the light-receiving end. Hence, the peak gain on the light-emitting end becomes smaller than that on the light-receiving end.

Moreover, the wavelength at which the gain of the amplifier reaches its peak (hereinafter referred to as "gain peak wavelength") is shifted toward the longer wavelengths in the vicinity of light-emitting end due to the carrier energy lowering phenomenon, which can be seen from Curve $b_2$ as compared with Curve $b_1$ in FIG. 1. As a result, the gain at the wavelength $\omega_1$ of optical signals further decreases in the vicinity of the light-emitting end.

If the wavelength of optical signals is set at $\omega_2$ which is a gain peak wavelength in the light-emitting end and longer than the gain peak wavelength $\omega_1$ in the vicinity of light-receiving end, the gain of the amplifier in the vicinity of the light-emitting end does not decrease so much compared with the gain in the light-receiving end. However, this approach reduces the overall gain of the optical amplifier from receiving end to emitting end.

FIG. 2 shows spectral dependence curves $a_1$ and $a_2$ of gain observed in the vicinity of a light-receiving end in an optical amplifier and observed in the vicinity of a light-emitting end, respectively, according to the principle of the present invention.

In the present invention a shift of the band gap wavelength in the active layer toward the shorter wavelengths in the vicinity of the light-emitting end compensates a shift in the spectral dependence of gain toward the longer wavelengths on the contrary, which enables to obtain a sufficiently large gain at the wavelength of optical signals as shown in FIG. 2 although the peak gain slightly decreases. Accordingly, it is expected that a semiconductor optical amplifier having a high saturation optical output power can be obtained.

Especially, in the case where a MQW active layer having a tensile strain is used and the amount of strain is relatively large in the vicinity of the light-emitting end, the spectral dependence of gain becomes steep so that the saturation value of optical output power is expected to substantially increase. The above-described structure can be obtained by using a selective MOVPE (metal organic vapor phase epitaxy) growing technique which was developed by the inventors of the present invention.

BRIEF DESCRIPTION OF THE DRAWINGS

The above and other objects, features and advantages of the present invention will be more apparent from the following description, taken in conjunction with the accompanying drawings in which.

DESCRIPTION OF THE PREFERRED EMBODIMENTS

The present invention is now to be detailed with reference to the accompanying drawings.

Figure 1:
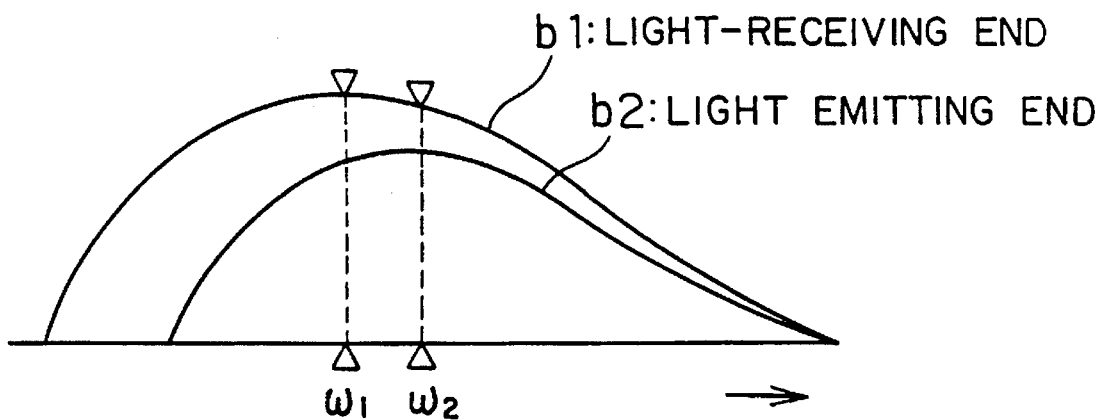
FIG. 1 is a graph showing the spectral dependence of gain in a conventional optical amplifier observed in the vicinity of its light-receiving end and in the vicinity of its light-emitting end.
Figure 2:
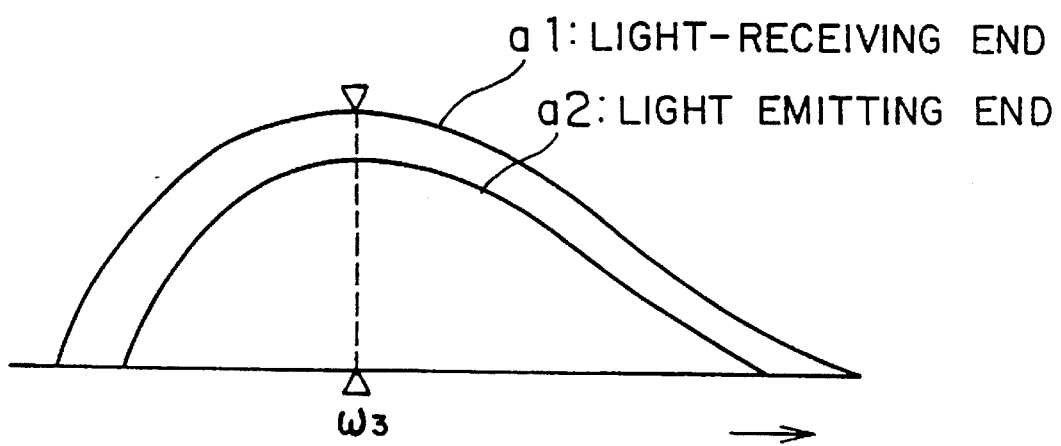
FIG. 2 is a graph exemplarily showing the spectral dependence of gain in a semiconductor optical amplifier according to the present invention, observed in the vicinity of its light-receiving end and in the vicinity of its light-emitting end.
Figure 3:
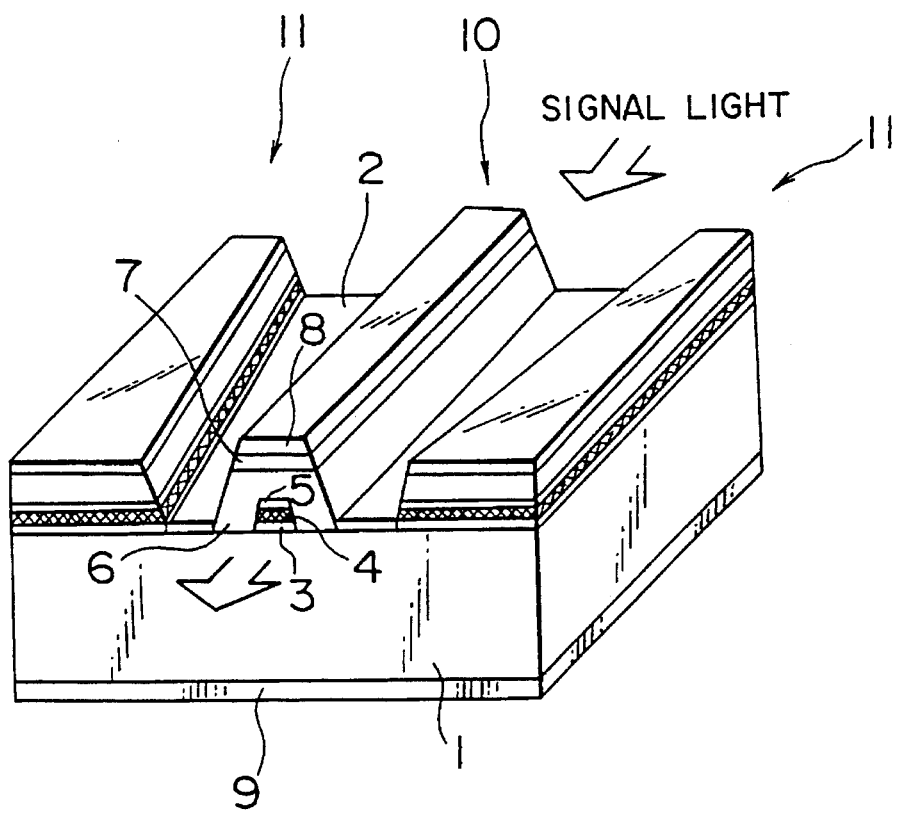
FIG. 3 is a perspective view of a semiconductor optical amplifier according to an embodiment of the present invention.
Figure 4:
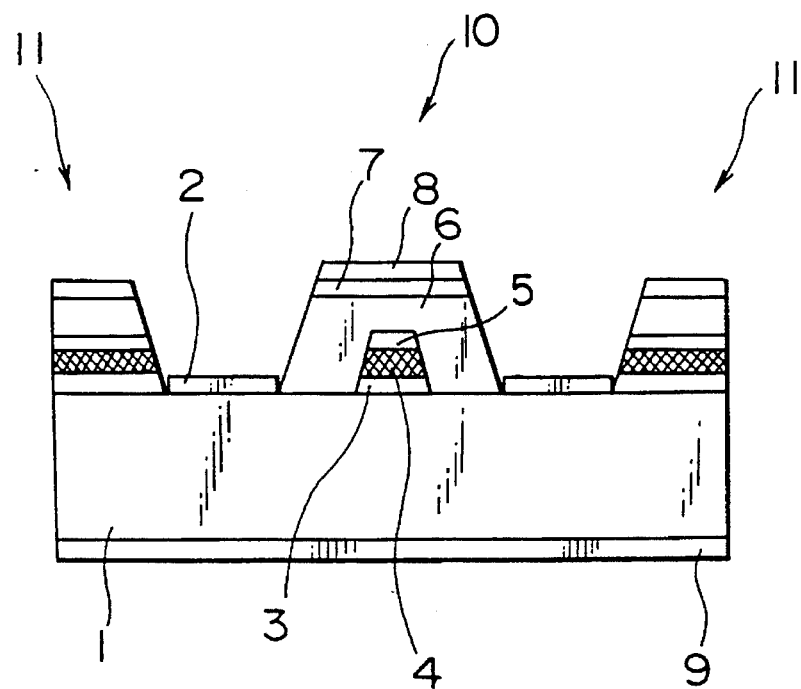
FIG. 4 is a cross-sectional view of the semiconductor optical amplifier shown in FIG. 3.

FIG. 3 is a perspective view of a semiconductor optical amplifier according to an embodiment of the present invention while FIG. 4 is a cross-sectional view of the semiconductor optical amplifier of FIG. 3. In FIGS. 3 and 4, the optical amplifier comprises an n-InP substrate 1, a central amplifying section 10 and two laminated side-wings 11. Between the central amplifying section 10 and each of laminated side-wings 11, a mask piece 2 is deposited on the substrate 1. The mask piece 2 has a large width end (e. g. 15 μm) adjacent to the light-receiving end of the central amplifying section 10 while the mask piece 2 has a small width end (e. g. 6 μm) adjacent to the light-emitting end of the central amplifying section 10.

A process for manufacturing the optical amplifier of the embodiment will be described with reference to FIG. 4. First, an insulating film made of silicon dioxide was formed on the n-InP substrate 1. A part of the oxide mask 2 was then selectively removed out of the central portion of the main surface where the optical amplifying section 10 was to be formed so that 500 μm in length×0.8μ in width of the main surface was exposed. Both sides of each mask 2 were also removed so that the masked regions have widths which vary gradually from 6 μm on the light-emitting side to 15μm on the light-receiving side of the amplifier.

Subsequently, a 0.3 μm-thick n-InP buffer layer 3, a 0.2 μm-thick undoped InGaAsP active layer 4 corresponding to a central emission wavelength of 1.3 μm having a composition of, for instance, $In_{0.72}Ga_{0.28}As_{0.61}P_{0.39}$ and a 0.2 μm-thick p-InP clad layer 5 were laminated selectively and consecutively on the unmasked regions of the substrate by a selective MOVPE growing method. Sidewalls of the grown layers exhibited the (111) crystalline orientation and clean surfaces without roughness compared with unselectively grown and mesa-etched conventional sidewalls.

The grown layers had a trapezoidal cross-section and the width of the active layer 4 was about 0.4 μm at its longitudinally central portion. After growing the active layer 4 and the clad layer 5, the mask were etched-off for removal of 2 μm width in total from both the side-edges of the buffer layer 3 located on the central portion. A p-InP covering layer 6 (1 μm in thickness on the top of the mesa structure) and a p-InGaAsP contact layer 7 (0.5 μm in thickness on the top of the mesa structure having a composition corresponding to an emission wavelength of 1.2 μm) having a composition of, for instance, $In_{0.78}Ga_{0.22}As_{0.48}P_{0.52}$ were then formed consecutively to cover the mesa structure including the active layer 4 and the buffer layer 3. As shown in FIG. 4, unnecessary crystals were grown on the areas outside the masks to form laminated side-wings 11. However, ohmic electrodes were not formed on the laminated side-wings 11. Although the laminated side-wings 11 had no relation to performance of an optical amplification, they were left in a final product because elimination of wings 11 required an additional step in manufacturing process.

When crystals are selectively grown to form active layers, a large amount of indium is taken into the active layers which were located adjacently to the broad mask area so that the band gap wavelength of the InGaAsP layer grown on the substrate portion adjacent to the light-receiving end becomes longer than that grown on the substrate portion adjacent to the light-emitting end. This phenomenon was described in the literatures, for example, JP-A-92-105383. In this embodiment, band gap wavelength of the active layer in a region adjacent to 6 μm-wide mask end was 1325 nanometer (nm) while band gap wavelength in a region adjacent to 15 μm-wide mask end was 1350 nm.

Metallic electrodes 8 and 9 were then formed both on the p-type contact layer 7 and on the rear surface of the n-type substrate 1, respectively. Subsequently, the element was cut into a length of 500 μm, which was followed by coating anti-reflective films on both ends to obtain a desired semiconductor optical amplifier. When a driving current of 120 mA was injected into the amplifier, excellent characteristics were obtained, which provided a signal gain of 27 dB with a polarization dependence of gain equal to or less than 1 dB. The saturation level of optical output power was +12 dBm which is 4 dB higher than that of a similar conventional amplifier in which the active layer was uniform in terms of band gap composition and the saturation level of optical output power was +8 dBm.

As another embodiment, such a semiconductor optical amplifier was experimentally manufactured in which a tensile strain type MQW structure was employed for the active layer. As an active layer, five layers of InGaAsP well each having a thickness of 8 nm and a composition of, for instance, $In_{0.58}Ga_{0.42}As_{0.69}P_{0.31}$ corresponding to a wavelength of 1.38 μm and an InGaAsP barrier layer having a thickness of 6 nm and a composition of, for instance, $In_{0.85}Ga_{0.15}As_{0.33}P_{0.67}$ corresponding to a wave-length of 1.10 μm were consecutively formed on a substrate.

At that time, the strain value of thus grown well layers exhibited −1.0% in the vicinity of the light-receiving end and −1.4% in the vicinity of the light-emitting end. The band gap wavelength in the vicinity of the light-receiving end was 1320 nm while the band gap wavelength in the vicinity of the light-emitting end was 1345 nm. In a 1.5 μm-wide tesile-strained MQW active layer, the gain for TM mode is larger than that for TE mode so that the difference in the light confinement coefficients can be canceled out. Therefore, it was possible to obtain a polarization-insensitive semiconductor optical amplifier having a small polarization dependence of gain. Another amplifier was fabricated by a process similar to the process as described above. The optical amplifier was cut to a length of 500 μm for evaluation to show excellent characteristics. The signal gain was 29 dB while the polarization sensitivity of gain was 1 dB at most, the saturation optical output power was +15 dBm and the noise figure was 4.8 dB.

In the above-described embodiments, InP is used for the substrate semiconductor materials while InGaAsP is used as the active layer substance. However, materials used for the substrate and the active layer are not limited thereto, and other semiconductor materials such as GaAs are also available.

Moreover, although a bulk active layer or a tensile-strained MQW active layer is employed in the above-described embodiments, the active layer is not limited thereto and an ordinary strain-free MQW structure or a compressively strained MQW structure can also be used. Although anti-reflective films are coated on both ends to reduce the reflection coefficients, it is possible to employ a window end structure in which the ends are terminated by a semiconductor material.

What is claimed is:

1. A semiconductor optical amplifier comprising a substrate, at least one semiconductor active layer, formed overlying said substrate, for amplifying a signal light received through a light-receiving end of said active layer to emit the signal light through a light-emitting end of the active layer, said active layer having a first band gap wavelength in the vicinity of said light-receiving end and a second band gap wavelength in the vicinity of said light-emitting end, said first band gap wavelength being longer than said second band gap wavelength.

2. A semiconductor optical amplifier as defined in claim 1 further comprising a buffer layer sandwiched between said active layer and said substrate, said buffer layer and said active layer form a mesa structure.

3. A semiconductor optical amplifier as defined in claim 2 further comprising a mask piece extending substantially parallel to said buffer layer, said mask piece having a first end adjacent to said light-emitting end smaller in width than a second end adjacent to said light-receiving end.

4. A semiconductor optical amplifier as defined in claim 3 wherein said buffer layer and said active layer are grown by epitaxy.

5. A semiconductor optical amplifier as defined in claim 1 wherein said at least active layer is implemented by at least one layer of multiple quantum well.

6. A semiconductor optical amplifier as defined in claim 5 wherein said multiple quantum well is of tensile strained type and has an absolute strain value in the vicinity of light-emitting end larger than in the vicinity of light-receiving end.

7. A semiconductor optical amplifier as defined in claim 5 wherein said multiple quantum well is of compressively strained type.

* * * * *